(12) United States Patent
Oga et al.

(10) Patent No.: US 9,704,922 B2
(45) Date of Patent: Jul. 11, 2017

(54) SEMICONDUCTOR MEMORY DEVICE AND METHOD OF MANUFACTURING THE SAME WHILE AVOIDING PROCESS DAMAGE TO A VARIABLE RESISTANCE FILM

(71) Applicant: KABUSHIKI KAISHA TOSHIBA, Minato-ku (JP)

(72) Inventors: Atsushi Oga, Yokkaichi (JP); Mutsumi Okajima, Yokkaichi (JP); Takeshi Yamaguchi, Yokkaichi (JP); Hiroyuki Ode, Yokkaichi (JP); Toshiharu Tanaka, Yokkaichi (JP); Natsuki Fukuda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/850,527

(22) Filed: Sep. 10, 2015

(65) Prior Publication Data
US 2016/0351624 A1   Dec. 1, 2016

Related U.S. Application Data

(60) Provisional application No. 62/168,496, filed on May 29, 2015.

(51) Int. Cl.
*H01L 45/00* (2006.01)
*H01L 27/24* (2006.01)

(52) U.S. Cl.
CPC ...... *H01L 27/2436* (2013.01); *H01L 27/2463* (2013.01); *H01L 45/085* (2013.01);
(Continued)

(58) Field of Classification Search
CPC ............ H01L 45/1675; H01L 45/1683; H01L 45/1691
See application file for complete search history.

(56) References Cited

U.S. PATENT DOCUMENTS 7,800,091 B2 * 9/2010 Kamigaichi ........ H01L 27/2409
257/3
7,910,914 B2 * 3/2011 Tanaka .................. G11C 5/025
257/5
(Continued)

FOREIGN PATENT DOCUMENTS

JP   2008-277543      11/2008
TW     200715482 A    4/2007
(Continued)

OTHER PUBLICATIONS

Office Action issued Sep. 26, 2016 in U.S. Appl. No. 14/970,082.

*Primary Examiner* — Thanh V Pham
(74) *Attorney, Agent, or Firm* — Oblon, McClelland, Maier & Neustadt, L.L.P.

(57) ABSTRACT

According to one embodiment, this semiconductor memory device includes first conducting layers, a memory layer, and second conducting layers. The first conducting layers are laminated at predetermined pitches in a first direction perpendicular to a substrate. The first conducting layers extend in a second direction parallel to the substrate. The second conducting layer extends in the first direction. A memory layer surrounds a circumference of the second conductive layer. The first conductive layers is in contact with a side surface of the second conductive layer via the memory layer. The memory cells are provided at intersections of the first conducting layers and the second conducting layer.

7 Claims, 11 Drawing Sheets

(52) U.S. Cl.
CPC ........ *H01L 45/124* (2013.01); *H01L 45/1253* (2013.01); *H01L 45/146* (2013.01); *H01L 45/1675* (2013.01)

(56) References Cited

U.S. PATENT DOCUMENTS

| | | | |
|---|---|---|---|
| 8,138,489 B2* | 3/2012 | Tanaka | G11C 13/003 257/2 |
| 8,258,038 B2* | 9/2012 | Nozawa | H01L 27/101 257/E21.004 |
| 8,283,711 B2 | 10/2012 | Jin et al. | |
| 8,350,314 B2 | 1/2013 | Fukuzumi et al. | |
| 9,006,793 B2 | 4/2015 | Wei et al. | |
| 2008/0149913 A1 | 6/2008 | Tanaka et al. | |
| 2010/0202206 A1 | 8/2010 | Seol | |
| 2012/0104351 A1* | 5/2012 | Wei | H01L 27/2409 257/4 |
| 2014/0035026 A1* | 2/2014 | Jang | H01L 29/792 257/324 |
| 2014/0326939 A1 | 11/2014 | Yamato et al. | |
| 2015/0179659 A1 | 6/2015 | Takaki | |
| 2016/0293839 A1* | 10/2016 | Suzuki | H01L 45/06 |

FOREIGN PATENT DOCUMENTS

| | | |
|---|---|---|
| TW | 201503290 A | 1/2015 |
| WO | WO 2011/016196 A1 | 2/2011 |
| WO | WO 2012/001960 A1 | 1/2012 |

* cited by examiner

SEMICONDUCTOR MEMORY DEVICE AND METHOD OF MANUFACTURING THE SAME WHILE AVOIDING PROCESS DAMAGE TO A VARIABLE RESISTANCE FILM

CROSS REFERENCE TO RELATED APPLICATIONS

This application is based on and claims the benefit of priority from prior US prior provisional Patent Application No. 62/168,496, filed on May 29, 2015, the entire contents of which are incorporated herein by reference.

FIELD

Embodiments described herein relate generally to a semiconductor memory device and a method of manufacturing the semiconductor memory device.

BACKGROUND

Recently, in association with highly integrated semiconductor memory devices, LSI devices constituting the semiconductor memory devices have been increasingly minute. For miniaturization of this LSI device, it is requested to improve dimensional accuracy and position accuracy of a circuit pattern in addition to simply thinning a line width. As a technique to overcome such problem, there has been proposed a Resistive RAM (ReRAM) that uses variable resistive elements, which reversibly change a resistance value, as a memory. This ReRAM includes the variable resistive element between a sidewall of a word line extending parallel to a substrate and a sidewall of a bit line extending perpendicular to the substrate. This structure ensures further highly integrated memory cell array.

In the ReRAM having the bit lines extending perpendicular to the substrate, a resistance change film constituting the variable resistive element is formed at the sidewall of the bit line. However, forming this resistance change film without causing a process damage is not easy.

BRIEF DESCRIPTION OF THE DRAWINGS

FIG. 3 is viewed from an X direction;

DETAILED DESCRIPTION

A semiconductor memory device according to the following embodiments includes first conducting layers, a memory layer, and second conducting layers. The first conducting layers are laminated at predetermined pitches in a first direction perpendicular to a substrate. The first conducting layers extend in a second direction parallel to the substrate. The second conducting layer extends in the first direction. A memory layer surrounds a circumference of the second conductive layer. The first conductive layers is in contact with a side surface of the second conductive layer via the memory layer. The memory cells are provided at intersections of the first conducting layers and the second conducting layer.

Next, the following describes a semiconductor memory device and a method of manufacturing the semiconductor memory device according to embodiments in detail with reference to the accompanying drawings. The respective drawings of the semiconductor memory devices used in the following embodiments are schematically illustrated. The thickness, the width, the ratio, and a similar parameter of the layer are not necessarily identical to actual parameters.

First Embodiment

Figure 1:
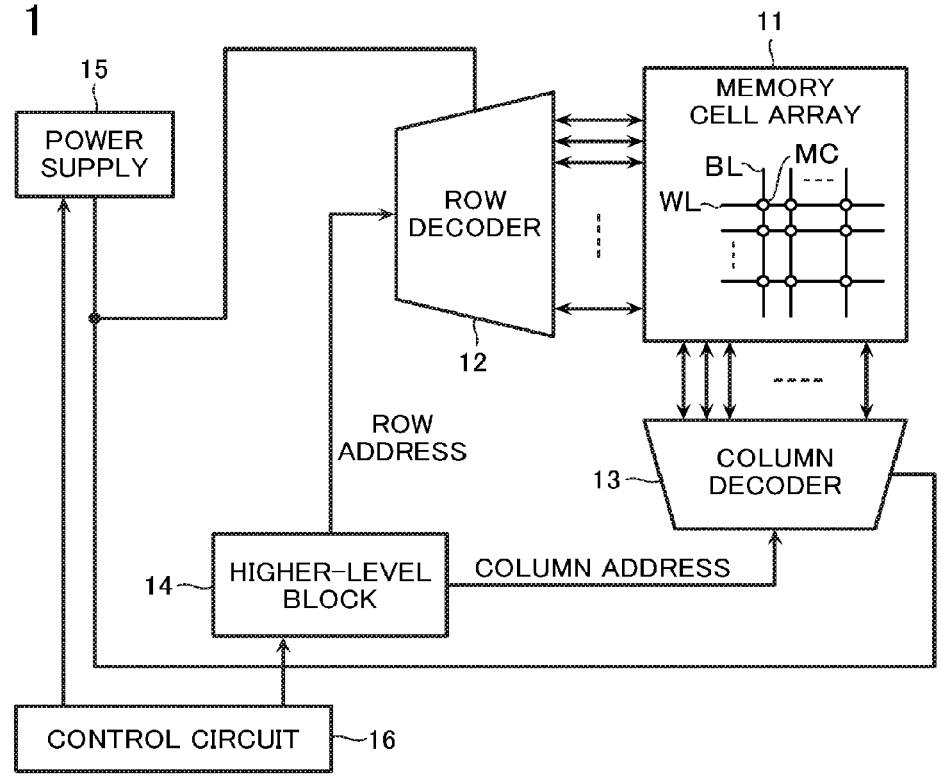
FIG. 1 is an exemplary block diagram of a semiconductor memory device according to a first embodiment.

First, the following describes an overall configuration of a semiconductor memory device according to the first embodiment. FIG. 1 is an exemplary block diagram of the semiconductor memory device according to the first embodiment. As illustrated in FIG. 1, the semiconductor memory device includes a memory cell array 11, a row decoder 12, a column decoder 13, a higher-level block 14, a power supply 15, and a control circuit 16.

The memory cell array 11 includes a plurality of word lines WL and bit lines BL, which intersect with one another, and memory cells MC, which are disposed in the respective intersecting portions of these lines. The row decoder 12 selects the word line WL for access (data erasing/writing/reading). The column decoder 13 includes a driver that selects the bit line BL for access to control an access operation.

The higher-level block 14 selects the memory cell MC in the memory cell array 11 to be accessed. The higher-level block 14 gives a row address and a column address to the row decoder 12 and the column decoder 13, respectively. The power supply 15 generates combinations of predetermined voltages corresponding to the respective operations of data erasing/writing/reading and supplies the combinations to the row decoder 12 and the column decoder 13. The control circuit 16 performs a control such as transmission of an address to the higher-level block 14 in response to an external command and controls the power supply 15.

Figure 2:
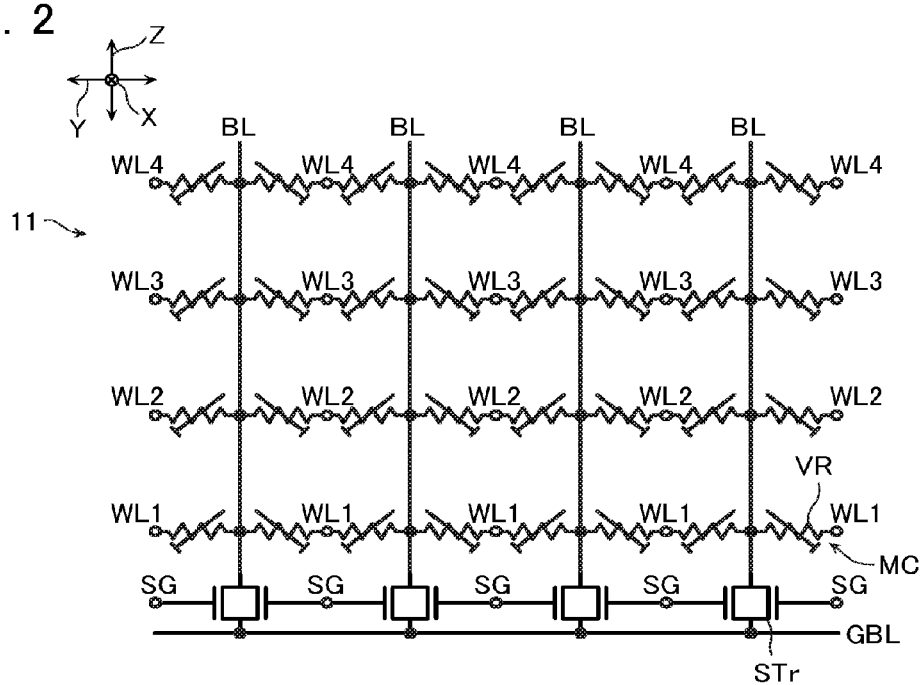
FIG. 2 is an exemplary circuit diagram of a memory cell array 11 according to the first embodiment.
Figure 3:
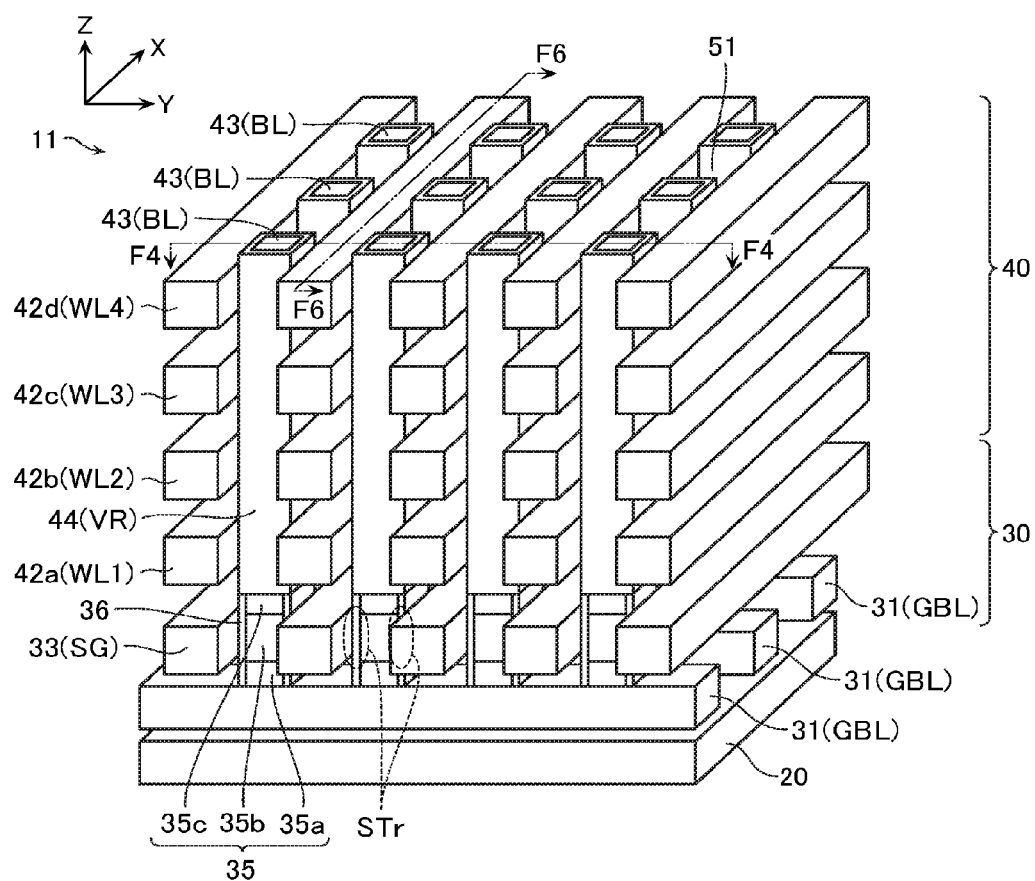
FIG. 3 is an exemplary perspective view illustrating a laminated structure of the memory cell array 11 according to the first embodiment.

The following describes the memory cell array 11 according to the first embodiment in detail with reference to FIG. 2 and FIG. 3. FIG. 2 is an exemplary circuit diagram of the memory cell array 11. FIG. 3 is an exemplary perspective view illustrating the laminated structure of the memory cell array 11. In FIG. 2, the X direction, the Y direction, and the Z direction are mutually orthogonal. The X direction is a direction the perpendicular to the paper. The structures illustrated in FIG. 2 are continuously disposed in the X direction. In FIG. 3, an interlayer insulating film is actually formed between the respective wirings. However, for simplification of the drawing, FIG. 3 omits the illustration of the interlayer insulating film.

As illustrated in FIG. 2, the memory cell array 11 includes selection transistors STr, global bit lines GBL, and selection gate lines SG in addition to the above-described word lines WL, bit lines BL, and memory cells MC.

As illustrated in FIG. 2 and FIG. 3, word lines WL1 to WL4 are disposed at predetermined pitches in the Z direction. The word lines WL1 to WL4 are formed so as to extend in the X direction as its longitudinal direction. The bit lines BL are disposed in a matrix in the X direction and the Y direction. The bit lines BL are formed so as to extend in the Z direction as its longitudinal direction. The memory cells MC are disposed at portions where these word lines WL and bit lines BL intersect. Accordingly, the memory cells MC are disposed in a three-dimensional matrix, the X direction, the Y direction, and the Z direction in the memory cell array 11. In various operations, an identical voltage is applicable to the selected word line WL among the word lines WL1 to WL4, regardless of the position in the Z direction. An identical voltage is applicable to the non-selected word line WL among the word lines WL1 to WL4, regardless of the position in the Z direction.

As illustrated in FIG. 2, the memory cell MC includes a variable resistive element VR. The memory cell MC including the variable resistive element VR is electrically rewritable. The memory cell MC stores data in a non-volatile manner based on the resistance value given to the variable resistive element VR. The variable resistive element VR changes from the high resistance state (a reset state) to the low resistance state (a setting state) by a setting operation. The setting operation applies a voltage at a certain magnitude or more to both ends of the variable resistive element VR. The variable resistive element VR changes from the low resistance state (the setting state) to the high resistance state (the reset state) by a reset operation. The reset operation applies a voltage at a certain magnitude or more to both ends of the variable resistive element VR.

Immediately after the manufacture, the variable resistive element VR is in a state of not easily changing its resistance state and in the high resistance state. Therefore, a forming operation, which applies a high voltage equal to or more than the setting operation and the reset operation to both ends of the variable resistive element VR, is performed. This forming operation forms a region where a current is likely to locally flow in the variable resistive element VR (a filament path). This allows the variable resistive element VR to easily change the resistance state, being an operable state as a storage element.

As illustrated in FIG. 2, the selection transistor STr is disposed between the one end of the bit line BL and the global bit line GBL. The global bit lines GBL are disposed at predetermined pitches in the X direction. The global bit lines GBL are formed so as to extend in the Y direction as its longitudinal direction. The one global bit line GBL is connected to the one end portion of the plurality of selection transistors STr, which are disposed in a line in the Y direction, in common. A gate electrode of the two selection transistors STr, which are adjacently disposed in the Y direction, is connected in common.

The selection gate lines SG are disposed at predetermined pitches in the Y direction. The selection gate lines SG are formed so as to extend in the X direction as its longitudinal direction. The one selection gate line SG is connected to the gates of the plurality of selection transistors STr, which are disposed in a line in the X direction, in common. The gate electrode of the two selection transistors STr, which are adjacently disposed in the Y direction, can be separated. Thus, the two selection transistors STr each can be independently operated.

Figure 4:
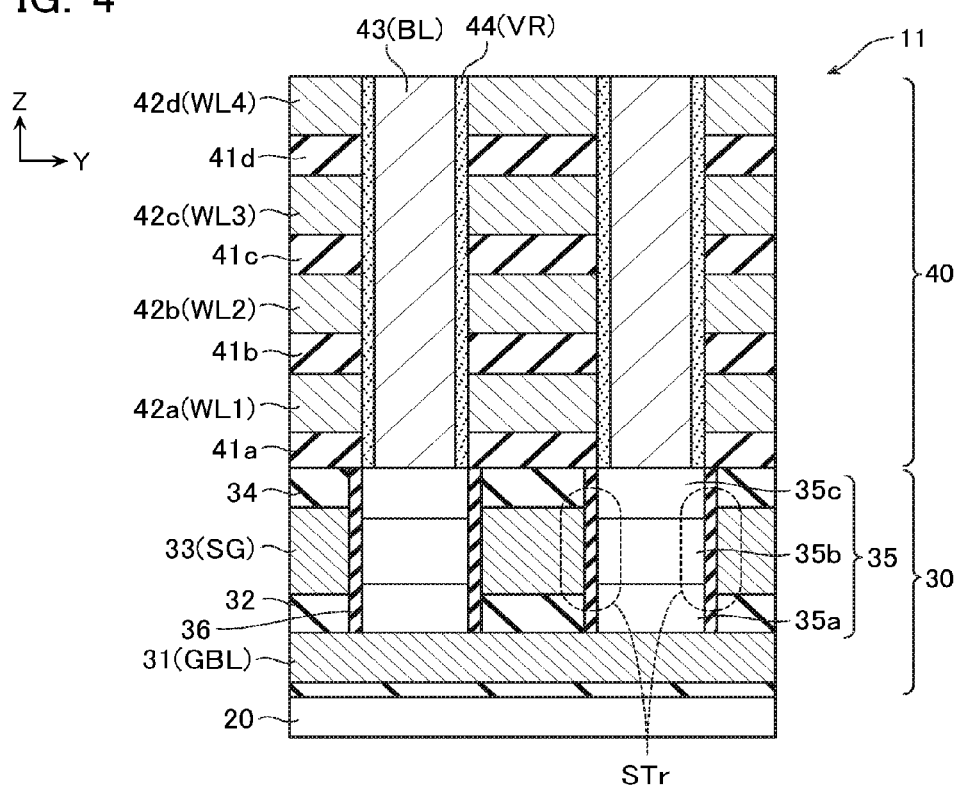
FIG. 4 is a drawing when
Figure 5:
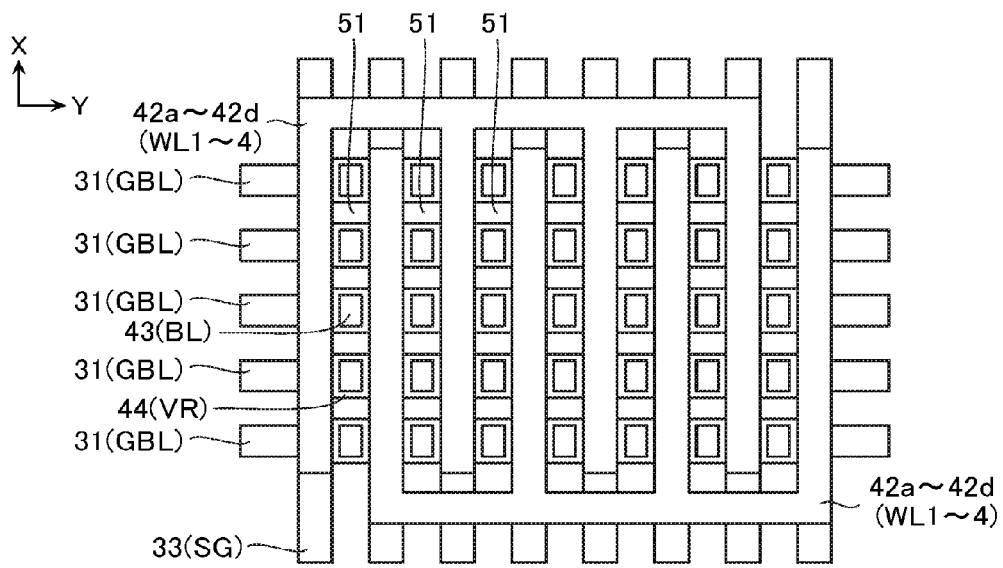
FIG. 5 is a top view of FIG. 3.

The following describes the laminated structure of the memory cell array 11 according to the first embodiment with reference to FIG. 3, FIG. 4, and FIG. 5. FIG. 4 is a drawing when the F4-F4 plane in FIG. 3 is viewed from the X direction (Z-Y plane). FIG. 5 is a top view of FIG. 3. FIG. 3 and FIG. 5 omit an interlayer insulating layer.

The memory cell array 11, as illustrated in FIG. 3 and FIG. 4, includes a selection transistor layer 30 and a memory layer 40 laminated over a substrate 20. The selection transistor layer 30 functions as the selection transistor STr. The memory layer 40 functions as the memory cell MC.

As illustrated in FIG. 3 and FIG. 4, the selection transistor layer 30 includes conducting layers 31, interlayer insulating layers 32, conducting layers 33, and interlayer insulating layers 34. These conducting layers 31, interlayer insulating layers 32, conducting layers 33, and interlayer insulating layers 34 are laminated in the Z direction, which is perpendicular to the substrate 20. The conducting layer 31 functions as the global bit line GBL while the conducting layer 33 functions as the gate of the selection gate line SG and the selection transistor STr.

The conducting layers 31 are disposed at predetermined pitches in the X direction, which is parallel to the substrate 20. The conducting layers 31 are formed so as to extend in the Y direction as its longitudinal direction (see FIG. 4). The interlayer insulating layers 32 cover the top surfaces of the conducting layers 31. The conducting layers 33 are disposed at predetermined pitches in the Y direction. The conducting layers are formed so as to extend in the X direction as its longitudinal direction (see FIG. 4). The interlayer insulating layers 34 cover the lateral faces and the top surface of the conducting layer 33. The conducting layers 31 and 33 can be made of, for example, polysilicon. The interlayer insulating layers 32 and 34 can be made of silicon oxide ($SiO_2$).

As illustrated in FIG. 3 and FIG. 4, the selection transistor layer 30 includes columnar semiconductor layers 35 and gate insulating layers 36. The columnar semiconductor layer 35 functions as a body (a channel) of the selection transistor STr. The gate insulating layer 36 functions as the gate insulating film of the selection transistor STr.

The columnar semiconductor layers 35 are disposed in a matrix in the X and Y directions. The columnar semiconductor layer 35 has a columnar shape and extends in the Z direction as its longitudinal direction. The columnar semiconductor layer 35 is in contact with the top surfaces of the conducting layers 31. The columnar semiconductor layer 35 is in contact with the lateral face of the conducting layer 33 in the Y direction via the gate insulating layer 36. The columnar semiconductor layer 35 includes an N+ type semiconductor layer 35a, a P+ type semiconductor layer 35b, and an N+ type semiconductor layer 35c, which are laminated.

As illustrated in FIG. 3 and FIG. 4, the lateral face of the N+ type semiconductor layer 35a in the Y direction is in contact with the interlayer insulating layer 32. The lateral face of the P+ type semiconductor layer 35b in the Y direction is in contact with the lateral face of the conducting layer 33. The lateral face of the N+ type semiconductor layer 35c in the Y direction is in contact with the interlayer insulating layer 34. The N+ type semiconductor layers 35a and 35c can be made of polysilicon into which N+ type impurities are injected. The P+ type semiconductor layer 35b can be made of polysilicon into which P+ type impurities are injected. The gate insulating layer 36 can be made of, for example, silicon oxide ($SiO_2$).

FIG. 3 and FIG. 4 illustrate the example where the selection transistor layer 30 is formed under the memory layer 40. However, instead of this, the selection transistor layer 30 may be disposed on the memory layer 40. That is, the selection transistor STr may be connected to the upper end side of a columnar conducting layer 43.

As illustrated in FIG. 3 and FIG. 4, the memory layer 40 includes interlayer insulating layers 41a to 41d and conducting layers 42a to 42d laminated in alternation in the Z direction. The conducting layers 42a to 42d each functions as the word lines WL1 to WL4. Viewed from the Z direction, the conducting layers 42a to 42d have a pair of comb shape each opposed in the X direction (see FIG. 5). The interlayer insulating layers 41a to 41d are made of, for example, silicon oxide ($SiO_2$). The conducting layers 42a to 42d are made of, for example, polysilicon or titanium nitride (TiN).

As illustrated in FIG. 3 and FIG. 4, the memory layer 40 includes columnar conducting layers 43 and variable resistance layers 44. The columnar conducting layer 43 functions as the bit line BL. The variable resistance layer 44 functions as the variable resistive element VR.

The columnar conducting layers 43 are disposed in a matrix in the X and Y directions. The lower end of the columnar conducting layer 43 is in contact with the top surface of the columnar semiconductor layer 35. The columnar conducting layer 43 extends in a columnar manner in the Z direction. The variable resistance layer 44 is formed into a closed loop shape over a whole circumference of the columnar conducting layer 43. That is, as illustrated in FIG. 4, the variable resistance layers 44 are disposed along both lateral faces of the columnar conducting layer 43 in the Y direction. As illustrated in FIG. 5, the variable resistance layers 44 are also disposed along both lateral faces of the columnar conducting layer 43 in the X direction (that is, the variable resistance layers 44 are positioned between the columnar conducting layers 43 and interlayer insulating films 51). The variable resistance layer 44 is formed into the closed loop shape over the whole circumference of the columnar conducting layer 43.

However, the variable resistance layer 44 is at least partially removed at a position between the bottom surface of the columnar conducting layer 43 and the columnar semiconductor layer 35. Accordingly, the columnar conducting layer 43 and the columnar semiconductor layer 35 have a part at which the columnar conducting layer 43 and the columnar semiconductor layer 35 are directly connected without the variable resistance layer 44 therebetween. The variable resistance layer 44 is formed into the closed loop shape so as to cover the lateral faces of the columnar conducting layer 43 over the whole circumference thereof. However, as illustrated in FIG. 3 and FIG. 5, the variable resistance layer 44 is not formed at the position between the interlayer insulating film 51 and the conducting layers 42a to 42d. The variable resistance layer 44 is disconnected at the position of this interlayer insulating film 51. The variable resistance layer 44 thus shaped can be obtained by a manufacturing method, which will be described later.

With such shape and manufacturing method of the variable resistance layer 44, the variable resistance layer 44 can be formed without causing the process damage, ensuring improving a yield. The columnar conducting layer 43 is made of a conductive material such as polysilicon, tungsten nitride (WN), tungsten (W), ruthenium (Ru), and titanium nitride (TiN); or a laminated body of a plurality of kinds of these materials. The variable resistance layer 44 can made of, for example, metal oxide (for example, $HfO_x$, $Al_2O_x$, $TiO_x$, ZrO, AlO, SiOx, $NiO_x$, $WO_x$, and $Ta_2O_x$) and the laminated body of these materials.

[Manufacturing Method]

Next, the following describes a method of manufacturing the semiconductor memory device according to the first embodiment with reference to FIG. 6 to FIG. 15. FIG. 6 to FIG. 15 are exemplary perspective views illustrating the method of manufacturing the memory cell array 11.

First, the structure of the selection transistor layer 30 is formed on the semiconductor substrate 20. Although specific illustrations are omitted in FIG. 6 and the subsequent drawings, an interlayer insulating film is formed on the semiconductor substrate 20. A metal wiring layer, which will be the global bit line GBL, is deposited on the layer. This metal wiring layer is separated by an isolation insulating film having its longitudinal direction in the Y direction. This forms a plurality of the global bit lines GBL (the conducting layers 31). Then, on the conducting layers 31, the interlayer insulating layers 32, and the conducting layers 33 and the interlayer insulating layers 34, which are formed having its longitudinal direction in the X direction, are deposited. After that, trenches reaching the conducting layers 31 are formed at predetermined intervals in the X-Y direction. The gate insulating layers 36 and the columnar semiconductor layer 35 are embedded into this trench. This completes the selection transistor layer 30 with the structure illustrated in FIG. 4.

Figure 6:
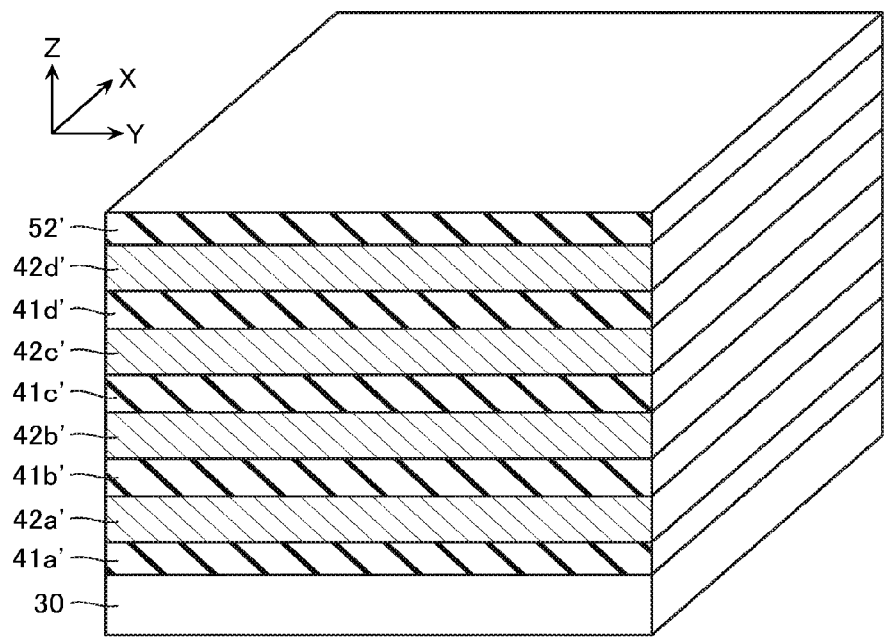
FIG. 6 to FIG. 16 are exemplary perspective views illustrating a method of manufacturing the memory cell array 11 according to the first embodiment.

Next, as illustrated in FIG. 6, the silicon oxide ($SiO_2$) and the polysilicon (Si) are laminated in alternation on the top surface of the selection transistor layer 30. Thus, a laminated body of interlayer insulating layers 41a' to 41d' and conducting layers 42a' to 42d' expanding in the X direction and the Y direction are formed. A protecting layer 52' is formed on the conducting layer 42d'.

Figure 7:
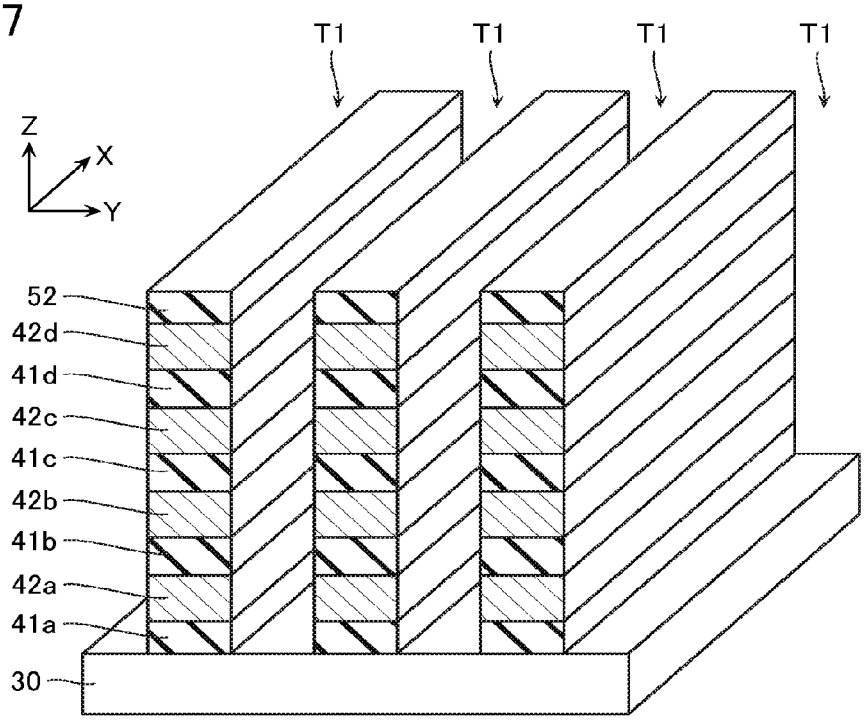

Next, as illustrated in FIG. 7, trenches T1 are formed. The trenches T1 divide the laminated body of the interlayer insulating layers 41a' to 41d', the conducting layers 42a' to 42d', and the protecting layer 52' into a plurality of stripe-shaped laminated bodies. The trenches T1 are disposed at predetermined pitches in the Y direction and extend in the X direction as its longitudinal direction. These trenches T1 divide the laminated body of the interlayer insulating layers 41a' to 41d', the conducting layers 42a' to 42d', and the protecting layer 52' into the stripe-shaped laminated bodies of the interlayer insulating layers 41a to 41d, the conducting layers 42a to 42d, and the protecting layer 52' extending in the X direction and disposed at predetermined pitches in the Y direction.

The above-described conventional method forms the state illustrated in FIG. 7, and then performs a process to sequentially embed a variable resistance layer, which will be a memory film, and a conducting layer, which will be the bit line BL, into the trench T1. However, to minimize damage to the variable resistance layer, this embodiment does not form the variable resistance layer at this phase. Instead of this, this embodiment forms the variable resistance layer and the conducting layer in the procedure as follows.

Figure 8:
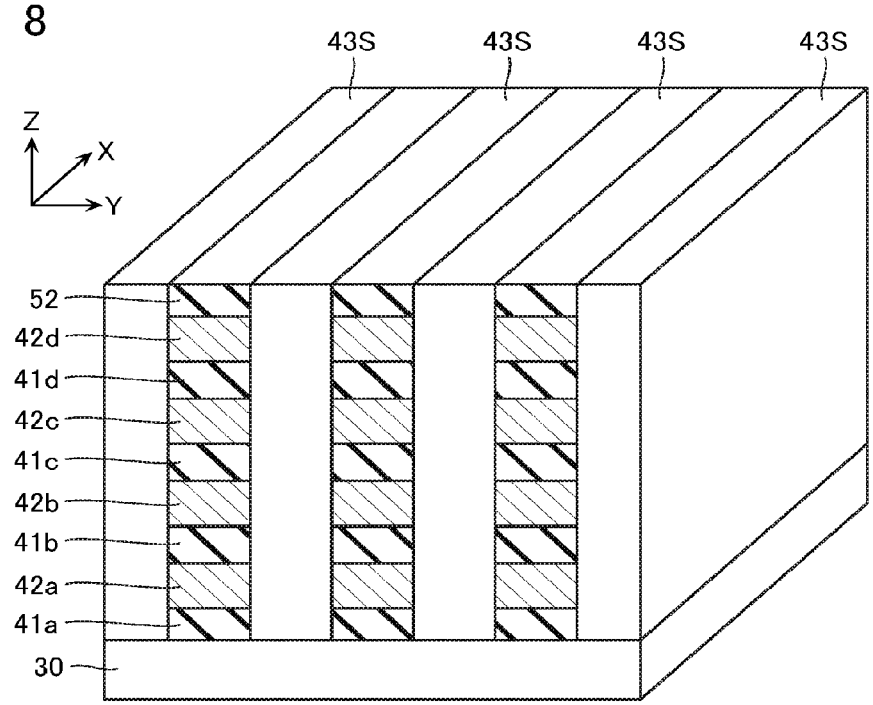

First, as illustrated in FIG. 8, after the process in FIG. 7, semiconductor layers 43S are formed so as to embed the trenches T1. The semiconductor layers 43S are formed so as to embed the stripe-shaped trenches T1. As described later, the semiconductor layer 43S is a sacrificial film removed by etching in a fabrication process. As a result, the semiconductor layer 43S is made of a material whose etching rate is higher compared with the conducting layers 42a to 42d. As one example, in the case where the conducting layers 42a to 42d are made of the material of titanium nitride, the semiconductor layer 43S can be made of the material of polysilicon.

In the case where the conducting layers 42a to 42d are made of the material of polysilicon to which impurities are doped, the semiconductor layer 43S can be made of polysilicon whose content of impurities differs from that of the conducting layers 42a to 42d (for example, non-doped polysilicon not containing impurities). After embedding the semiconductor layers 43S, the semiconductor layers 43S deposited outside the trenches T1 are removed by a CMP method for flattening.

Figure 9:
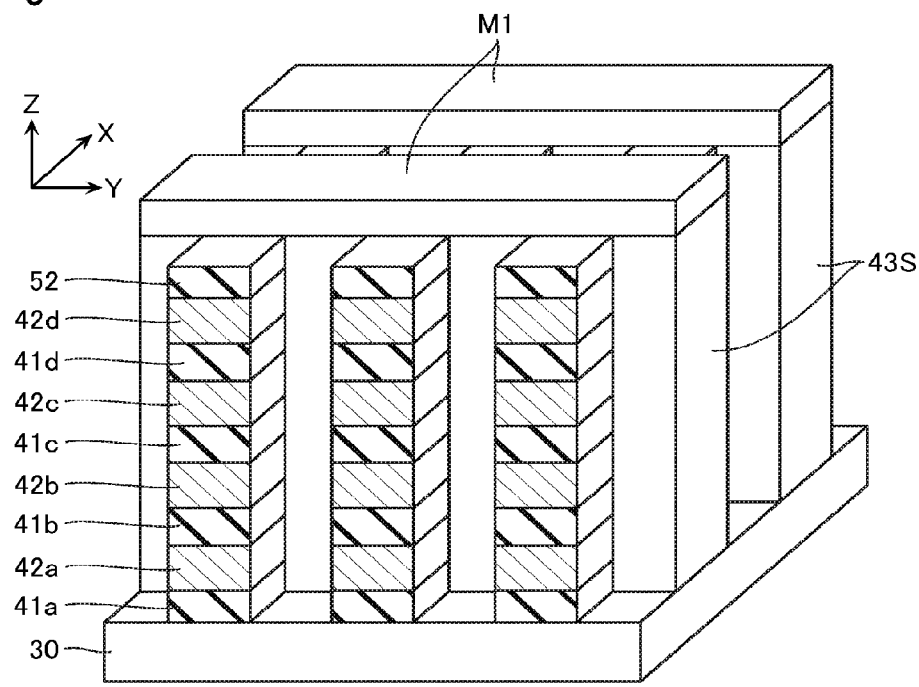

Next, as illustrated in FIG. 9, CMP stopper films M1 having its longitudinal direction in the Y direction are formed at predetermined pitches in the X direction. These CMP stopper films M1 are made of a material of, for example, a silicon nitride film.

Subsequently, using these CMP stopper films M1 as masks, the semiconductor layers 43S at positions not covered with the CMP stopper films M1 are selectively etched by an RIE method. For example, when the semiconductor layers 43S are made of the material of the non-doped polysilicon, the use of etching gas such as CHF3 allows selectively removing the semiconductor layers 43S by etching.

Figure 10:
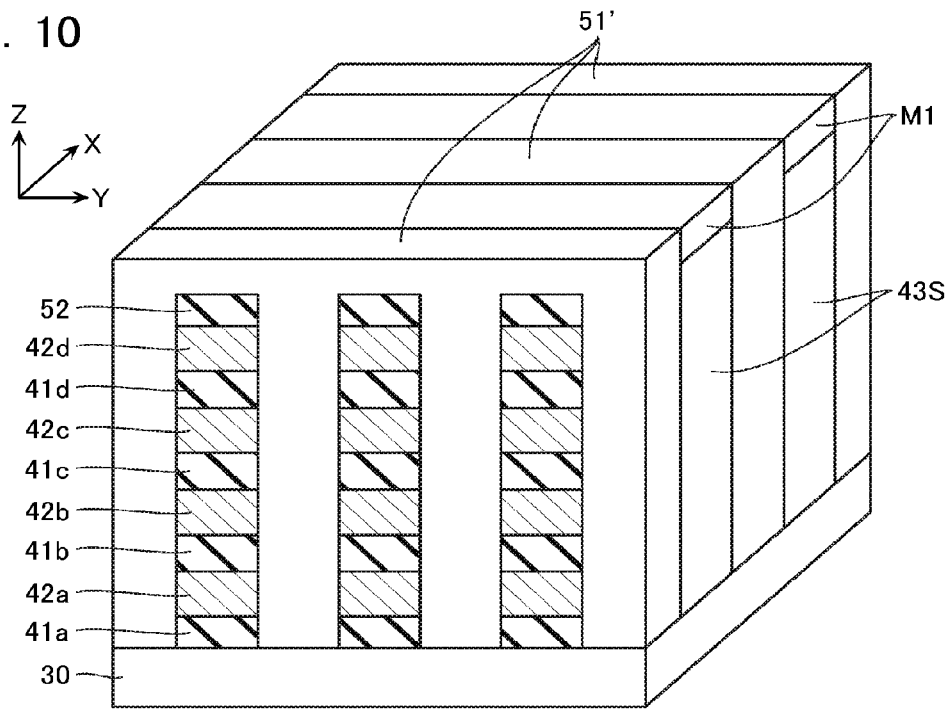

Then, as illustrated in FIG. 10, interlayer insulating films 51' are deposited so as to embed void portions generated by removing the semiconductor layers 43S. At this time, the interlayer insulating films 51' deposited outside the void portions are removed by the CMP method. In view of this, as illustrated in FIG. 10, the heights of the surfaces of the interlayer insulating films 51' and the surfaces of the masks M1 approximately match.

Figure 11:
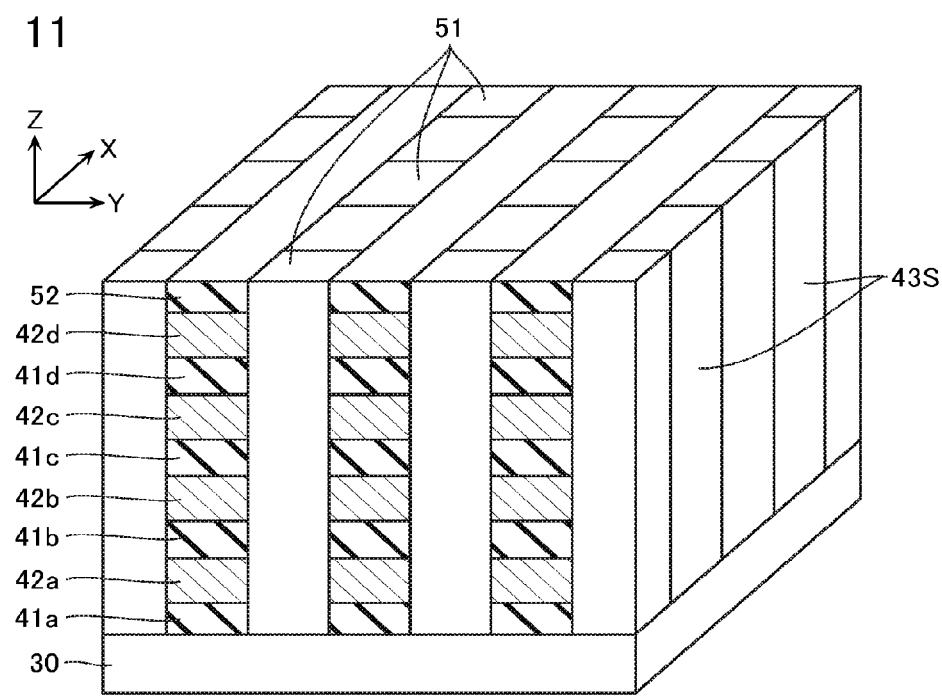
Figure 12:
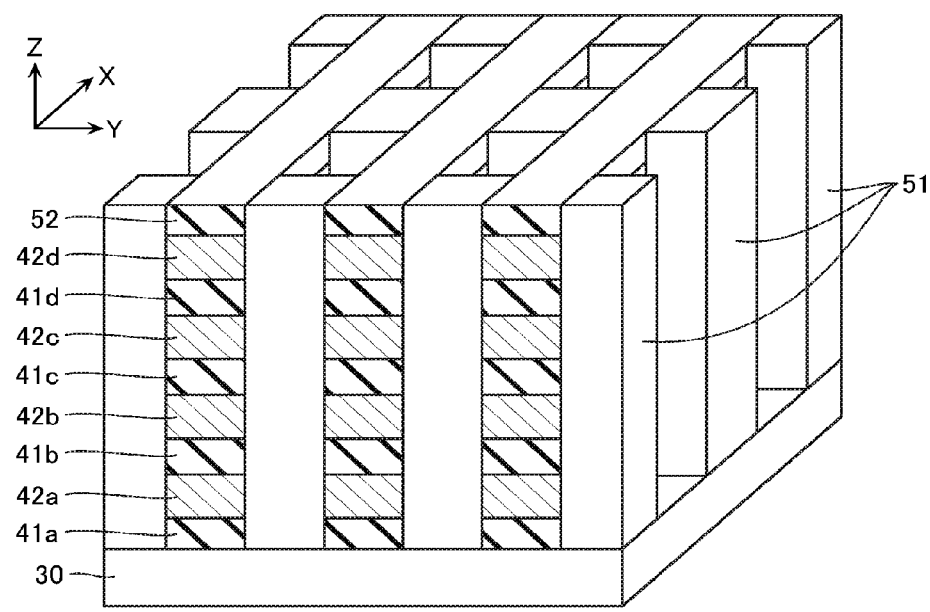

Further, as illustrated in FIG. 11, the CMP method is performed to remove CMP stopper films M1 and the interlayer insulating films 51', exposing the surfaces of the semiconductor layers 43S. As illustrated in FIG. 12, wet etching is performed to remove the semiconductor layers 43S.

Figure 13:
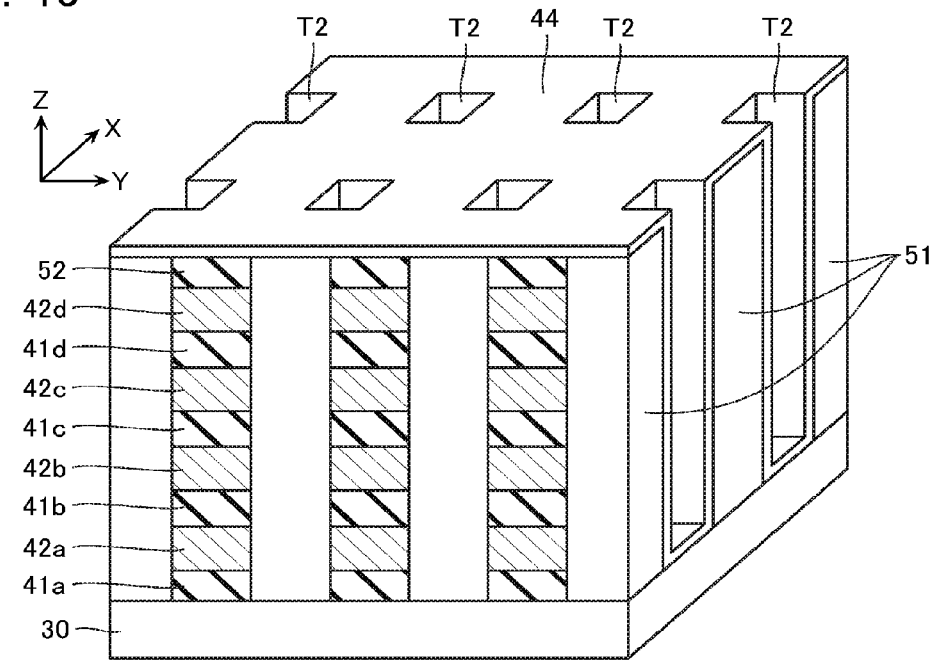

Next, as illustrated in FIG. 13, the variable resistance layers 44 are deposited on the entire memory area (including the part on the surface of the selection transistor layer 30) that includes the inner walls (the lateral faces and the bottom surfaces) of void portions T2, which are generated after the removal of the semiconductor layers 43S, by, for example, an atomic layer deposition (ALD). The variable resistance layer 44 can be made of, for example, the above-described metal oxides as the materials.

Figure 14:
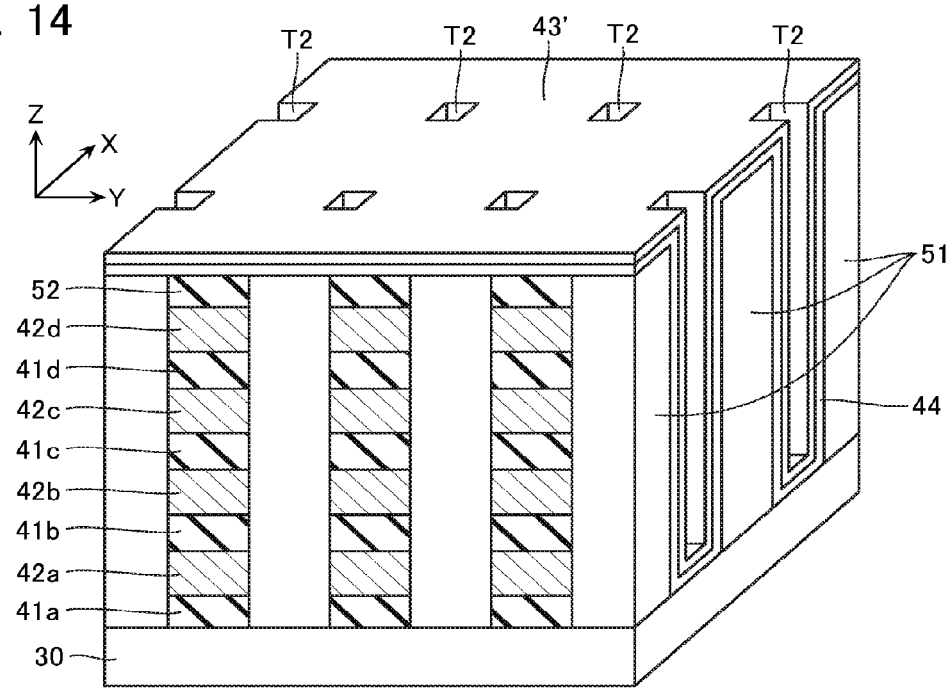

Further, as illustrated in FIG. 14, a polysilicon film 43' with a film thickness of, for example, approximately 5 to 10 nm is deposited by the CVD method or a similar method so as to cover the formed variable resistance layers 44. This polysilicon film 43' functions as the process protective film of the variable resistance layers 44.

Figure 15:
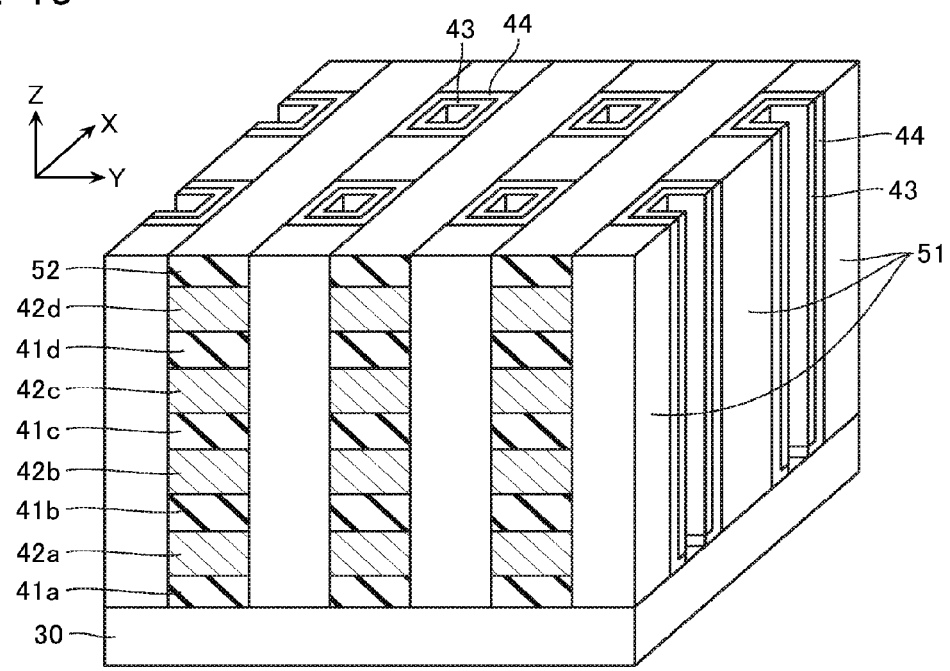
Figure 16:
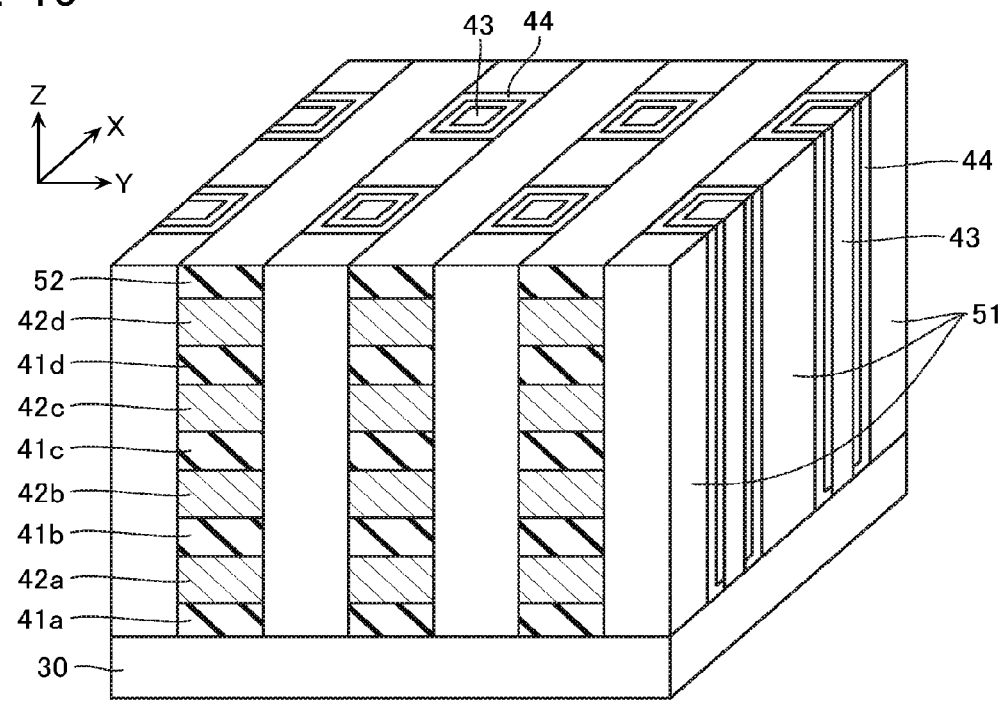

Subsequently, as illustrated in FIG. 15, the variable resistance layers 44 and the polysilicon films 43' deposited outside the void portions T2 and the bottom surfaces of the void portions T2 are removed by an RIE method to expose the surface of the selection transistor layer 30 (specifically, the columnar semiconductor layers 35 of the selection transistor layer 30). This is performed for better electrical connection between the columnar conducting layer 43 and the columnar semiconductor layer 35. However, even if the variable resistance layer 44 remains, as long as the electrical connection between both is properly maintained, the process of FIG. 15 can also be omitted.

Subsequently, the polysilicon film 43' as the process protective film is removed by etching. After that, polysilicon films are embedded into the void portions T2 by the CVD method or a similar method. This forms the above-described columnar conducting layers 43. Afterwards, a contact and a wiring layer are formed by the well-known method, thus completing the structure of the memory cell array 11.

As long as the polysilicon film 43' can be directly used as the columnar conducting layer 43, the process of removing the polysilicon film 43' by etching can also be omitted. That is, the columnar conducting layer 43 is constituted of the polysilicon film 43' and the additional polysilicon film. The additional polysilicon film is deposited to the inner wall of the polysilicon film 43' so as to embed the void portion T2.

According to the manufacturing method described in FIG. 6 to FIG. 16, the variable resistance layer 44 does not receive the process damage by the etching. With the above-described conventional method, the variable resistance layer 44 is formed at the process after the process of FIG. 7. Thereafter, the variable resistance layer 44 is exposed to the etching gas in the etching for embedding the interlayer insulating film, thus receiving the process damage.

However, with the manufacturing method of this embodiment, the variable resistance layers 44 are formed at the entire memory area including the inner walls of the void portions T2 at the process of FIG. 13. After that, the polysilicon films 43' as the process protective films protect the variable resistance layers 44. Afterwards, the etching removal process of the polysilicon film 43' (can be omitted) and the etching removal process of the polysilicon film 43' and the variable resistance layer 44 at the bottom surface of the void portion T2 are only performed. Accordingly, the process damage to the variable resistance layer 44 is reduced to the minimum. Thus, according to the embodiment, the process damage to the variable resistance layer 44 can be minimized, ensuring improving the yield.

When using this manufacturing method, the variable resistance layer 44 is formed so as to cover the lateral faces of the columnar conducting layer 43 over the whole circumference. Meanwhile, the variable resistance layers 44 are not formed at the positions sandwiched between the interlayer insulating films 51 and the conducting layers 42a to 42d.

Second Embodiment

Figure 17:
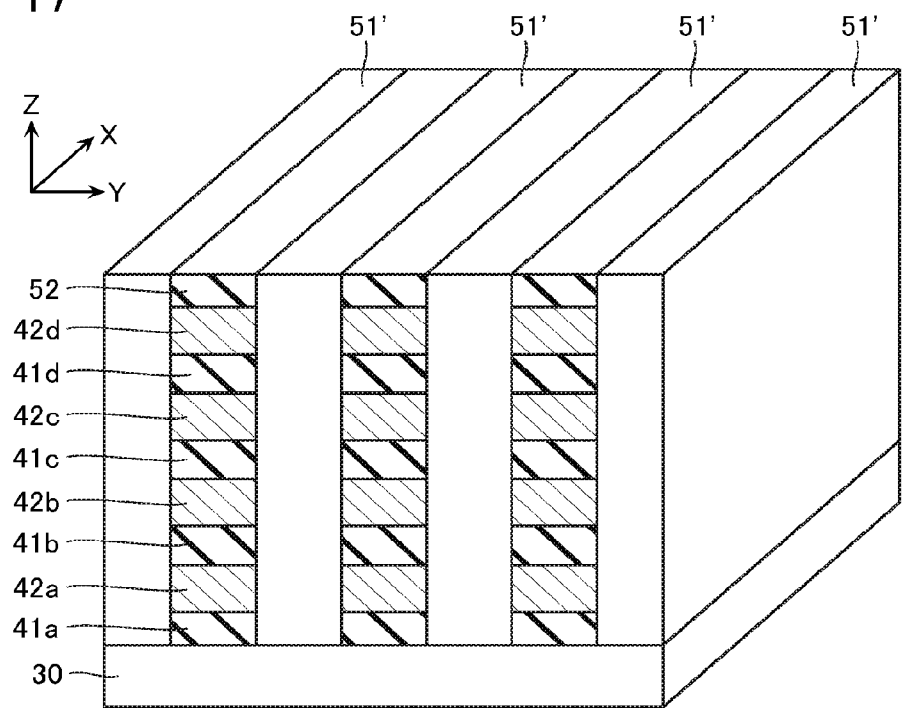
FIG. 17 and FIG. 18 are exemplary perspective views illustrating a method of manufacturing the memory cell array 11 according to a second embodiment.
Figure 18:
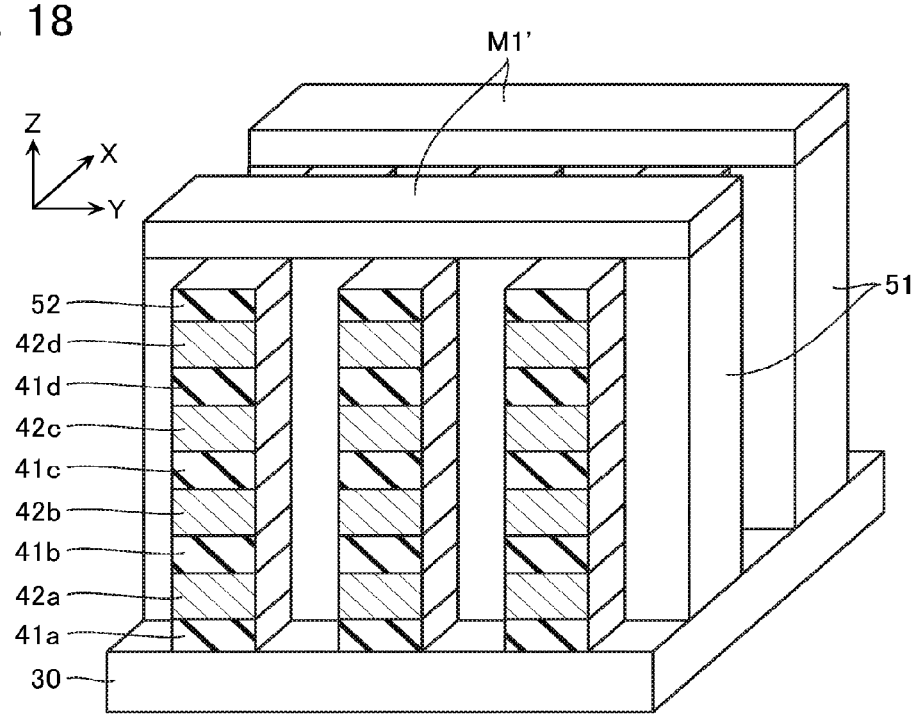

The following describes a semiconductor memory device according to the second embodiment with reference to FIG. 17 and FIG. 18. The structure of the semiconductor memory device of this second embodiment is similar to that of the first embodiment; therefore, the description is omitted. However, the semiconductor memory device of this second embodiment differs from the first embodiment in the manufacturing method.

The following describes the method of manufacturing the semiconductor memory device of the second embodiment with reference to FIG. 17 and FIG. 18. First, the processes described in FIG. 6 and FIG. 7 are performed to obtain the structure of FIG. 7. Next, as illustrated in FIG. 17, the interlayer insulating films 51' are embedded into the trenches T1 with the structure of FIG. 7 by the CVD method or a similar method. In this respect, the second embodiment differs from the first embodiment, which embeds the semiconductor layers 43S that will be the sacrificial films into the trenches T1. The embedded interlayer insulating films 51' are flattened by the CMP method so as to match the top surfaces of an interlayer insulating films 52.

Next, as illustrated in FIG. 18, the CMP stopper films M1' having its longitudinal direction in the Y direction are formed at predetermined pitches in the X direction. These CMP stopper films M1 are made of a material of, for example, a silicon nitride film. Using these CMP stopper films M1' as masks, the interlayer insulating films 51' at positions not covered with the CMP stopper films M1' are selectively etched by the RIE method. This obtains the structure approximately identical to the structure of FIG. 12 of the first embodiment.

Although the illustration is omitted, thereafter, the execution of the processes illustrated in FIG. 13 to FIG. 16 obtains the structure identical to the structure of the first embodiment.

By the manufacturing method of the second embodiment as well, the variable resistance layers 44 are formed at the entire memory area including the inner walls of the void portions T2. After that, the polysilicon films 43' as the process protective films protect the variable resistance layers 44. Thus, according to the second embodiment as well, the process damage to the variable resistance layer 44 can be minimized, ensuring improving the yield similar to the first embodiment.

This manufacturing method of the second embodiment eliminates the need for forming the sacrificial film. This allows reducing a count of processes compared with the first embodiment.

Third Embodiment

Figure 19:
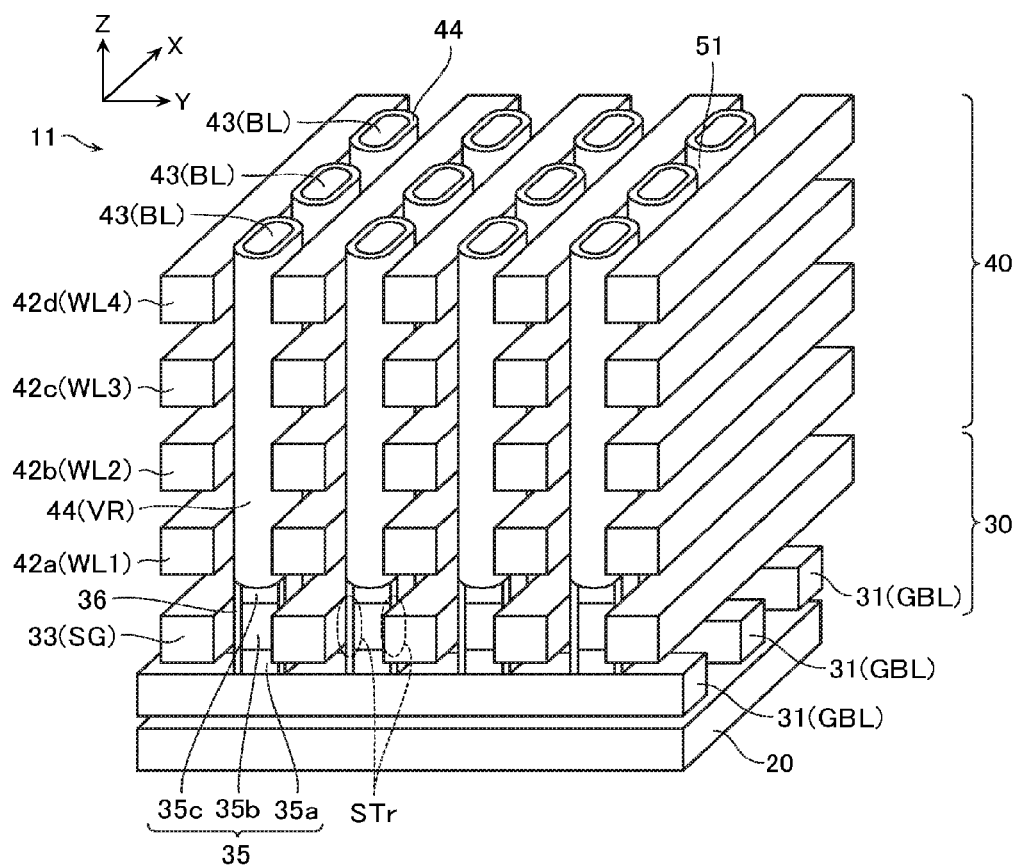
FIG. 19 is an exemplary perspective view illustrating a laminated structure of the memory cell array 11 according to a third embodiment.

The following describes a semiconductor memory device according to the third embodiment with reference to FIG. 19. The basic constitution of this third embodiment is similar to the above-described embodiment (FIG. 1 and FIG. 2). However, this third embodiment differs from the above-described embodiments in the shapes of the columnar conducting layer 43 (the bit line BL) and the variable resistance layer 44.

FIG. 19 is a schematic perspective view of the semiconductor memory device according to the third embodiment and corresponds to FIG. 3. Like reference numerals designate identical configurations to FIG. 3, and therefore such configurations will not be further elaborated or will be briefly described here.

With the semiconductor memory device of this third embodiment, the columnar conducting layer 43 is formed into an oval shape or a elliptical shape having its longitudinal direction in the X direction. The outline of the variable resistance layer 44 is similarly formed into the oval shape or the elliptical shape so as to cover the peripheral area of the columnar conducting layer 43. For example, instead of the stripe-shaped masks M1, which are illustrated in FIG. 9, such shape can be formed by using the mask having the oval-shaped or the elliptical-shaped opening.

This third embodiment can also provide the effect similar to the above-described embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising:
   forming a laminated body where interlayer insulating films and conducting layers are laminated in alternation above a semiconductor substrate;
   dividing the laminated body by a plurality of first trenches whose longitudinal direction is a first direction, the first trenches being arranged in a second direction intersecting with the first direction;
   forming sacrificial films in the first trenches, the sacrificial films being formed at predetermined intervals in the first direction;
   forming insulating layers in the first trenches at predetermined intervals in the first direction so as to embed a void portion between the sacrificial films;
   removing the sacrificial films;
   forming a variable resistance layer along a lateral face of the laminated body and lateral faces of the insulating layers, the lateral face of the laminated body and the lateral faces of the insulating layers being at a position where the sacrificial films had been removed; and
   forming conducting layers along lateral faces of the variable resistance layer.

2. The method of manufacturing the semiconductor memory device according to claim 1, wherein
   after the variable resistance layer is formed, the variable resistance layer formed on the bottom of the first trenches is removed, and thereafter the conducting layers are formed along the lateral faces of the variable resistance layer.

3. The method of manufacturing the semiconductor memory device according to claim 2, wherein
   a process protective film is formed along the lateral face of the variable resistance layer, and
   subsequently the variable resistance layer formed on the bottom of the first trenches is removed.

4. The method of manufacturing the semiconductor memory device according to claim 3, wherein
   the process protective film is formed of a material identical to a material of the conducting layers.

5. The method of manufacturing the semiconductor memory device according to claim 1, wherein
   the sacrificial films are made of a material whose etching rate is higher than an etching rate of the conducting layers under a predetermined etching condition.

6. The method of manufacturing the semiconductor memory device according to claim 1, wherein
   forming the sacrificial films in the first trenches further includes:
      embedding the sacrificial films in the first trenches; and
      then removing the sacrificial films by etching at the predetermined intervals in the first direction,
   and wherein
   forming the insulating layers further includes
      forming the insulating layers in the first trenches at a position where the sacrificial films had been etched.

7. The method of manufacturing the semiconductor memory device according to claim 1, wherein the sacrificial films are removed by wet etching.

* * * * *